United States Patent
Dass et al.

[11] Patent Number: 6,162,652
[45] Date of Patent: Dec. 19, 2000

[54] PROCESS FOR SORT TESTING C4 BUMPED WAFERS

[75] Inventors: M. Lawrence A. Dass, Fremont; Amir Roggel, Sunnyvale; Krishna Seshan, San Jose, all of Calif.

[73] Assignee: Intel Corporation, Santa Clara, Calif.

[21] Appl. No.: 09/001,969

[22] Filed: Dec. 31, 1997

[51] Int. Cl.[7] .............................. H01L 21/66; H01L 21/44
[52] U.S. Cl. .............................. 438/18; 438/15; 438/613; 438/614
[58] Field of Search .................................. 438/15, 17, 18, 438/611–615, 118; 257/737, 738

[56] References Cited

U.S. PATENT DOCUMENTS

| | | | |
|---|---|---|---|
| 5,341,990 | 8/1994 | Nishikawa et al. | 228/205 |
| 5,376,584 | 12/1994 | Agarwala | 438/614 |
| 5,492,235 | 2/1996 | Crafts et al. | 216/13 |
| 5,592,736 | 1/1997 | Akram et al. | 29/842 |
| 5,651,873 | 7/1997 | Uchiyama et al. | 205/253 |
| 5,693,565 | 12/1997 | Camilletti et al. | 43/17 |
| 5,756,370 | 5/1998 | Farnworth et al. | 438/15 |
| 5,773,359 | 6/1998 | Mitchell et al. | 438/614 |
| 5,878,943 | 3/1999 | Nishikawa et al. | 228/205 |
| 5,904,555 | 5/1999 | Darbha et al. | 438/613 |
| 5,937,320 | 8/1999 | Andricacos et al. | 438/614 |

FOREIGN PATENT DOCUMENTS

| | | |
|---|---|---|
| 54-124129 | 9/1979 | Japan . |
| 4-144137 | 5/1992 | Japan . |

*Primary Examiner*—Olik Chaudhuri
*Assistant Examiner*—Alonzo Chambliss
*Attorney, Agent, or Firm*—Blakely, Sokoloff, Taylor & Zafman LLP

[57] ABSTRACT

A method of testing an integrated circuit device including depositing a solder bump on a surface of a bond pad on an integrated circuit device, heat treating the solder bump, and testing the integrated circuit device by probing the solder bump.

16 Claims, 7 Drawing Sheets

PROCESS FOR SORT TESTING C4 BUMPED WAFERS

BACKGROUND OF THE INVENTION

1. Field of the Invention

The invention relates to the field of semiconductor device testing and packaging and more particularly to integrated circuit bond pad testing and packaging.

2. Description of Related Art

In the manufacture of semiconductor devices, it is advisable that such devices be tested at the wafer level to evaluate their functionality. The process in which devices in a wafer are tested is commonly referred to as "wafer sort." Testing and determining design flaws at the wafer level offers several advantages. First, it allows designers to evaluate the functionality of new devices during development. Increasing packaging costs also make wafer sorting a viable cost saver, in that reliability and functionality of each die on a wafer may be tested before incurring the higher costs of packaging. Measuring reliability also allows the performance of the production process to be evaluated and production consistency rated, such as for example by "bin switching" whereby the performance of a die is downgraded because that die's performance did not meet the expected criteria.

FIG. 1 illustrates a surface view of the top side of an integrated circuit device. Metal interconnect lines and components of integrated circuit device 11 are formed on an underlying silicon substrate. The side of the silicon substrate on which the integrated circuit is formed shall herein be referred to as the top side of the silicon substrate. As illustrated in FIG. 1, bond pads 13 are located along the periphery of integrated circuit device 11. In the center of integrated circuit device 11 is the active region 12 containing the majority of the high density, active circuitry of integrated circuit device 11. To activate the circuitry within active region 12, it is necessary to supply voltage signals to bond pads 13. These voltage signals are supplied to bond pads 13 through a package to which integrated circuit device 11 is affixed.

FIG. 2 illustrates a cross-section of integrated circuit device 11 after packaging. After integrated circuit device 11 is affixed to package substrate 15, individual bond wires 14 are used to electrically couple each bond pad 13 to a corresponding pad on package substrate 15. Each corresponding pad 13 on package substrate 15 is then individually coupled to an external pin 16. The packaged integrated circuit device of FIG. 2 may then be placed within a socket in order to electrically couple external pin 16 to drivers that supply the necessary voltage signal to activate integrated circuit device 11. As illustrated in FIG. 2, integrated circuit device 11 is mounted to package substrate 15 with its top-side facing away from package substrate 15. In this manner, once integrated circuit device 11 is activated through package pin 16, the internal, active region 12 may be accessed and probed for testing since neither bond pads 13, package substrate 15, nor bond wires 14 obscure access to this region of integrated circuit device 11.

FIG. 3 illustrates a top-side view of a second bond pad configuration on an integrated circuit device. As illustrated in FIG. 3, bond pads 21 of integrated circuit device 20 are formed along the top of the entire integrated circuit device so that the bond pads now reside directly over the active circuitry region of integrated circuit device 20. By forming bond pads in both the center and periphery of integrated circuit device 20, more bond pads can be placed across the surface of the device than can be placed only within the peripheral region. In addition, active circuitry which underlies bond pads 21 of integrated circuit device can be directly coupled to its nearest bond pad using relatively short interconnect lines. This minimizes the resistive, capacitive, and inductive effects associated with routing interconnect lines over long distances, improving speed performance.

FIG. 4 is an illustration of a cross-section of integrated circuit device 20 after mounting to a package substrate 22. In order to mount integrated circuit device 20 to package substrate 22, solder balls 24 are placed on each of bond pads 21 to electrically couple each bond pad 21 to its corresponding solder ball on package substrate 22. Each corresponding solder ball on package substrate 22 is, in turn, coupled to an external pin 23. Integrated circuit device 20 is mounted to package substrate 22 with its top-side facing towards the package substrate. In other words, in comparison to the method used to mount integrated circuit device 11 to its package substrate in FIG. 2, integrated circuit device 20 is "flipped." For this reason, the design of integrated circuit device 20 illustrated in FIG. 3 and its subsequent packaging method illustrated in FIG. 4 is referred to as flip-chip technology. The technology is also known as Controlled Collapsable Chip Connection (C4), named after the package mounting technique of using solder to replace bond wires.

Integrated circuit device 11 (as shown in FIG. 1) or integrated circuit device 20 (as shown in FIG. 3) illustrate bond pads 13 and 21, respectively, available for electrical coupling to a corresponding pad on package substrate, 15 and 22, respectively. In general, after the device is made, bond pads 13 and 21, respectively, lie beneath dielectric layers and must be exposed for bonding to package 15 and 22, respectively. In the typical process, bond pads 13 and 21, respectively, are covered by a hard passivation layer of, for example, silicon nitride ($Si_3N_4$). This hard passivation layer is covered by a soft passivation layer of, for example, a photodefinable polyimide. The hard and soft passivation layers protect the device from the ambient, for example, scratches, moisture, and impurities. The bond pads of the integrated circuit device are exposed by removing the hard and soft passivation layers over the top surface of the bond pads. Techniques for opening a bond pad are well known in the art.

In the case of the C4 platform devices (as illustrated in FIGS. 3–4), once the bond pads are opened, a base layer of conductive material is placed over the bond pad. In one example, the base layer of conductive material includes a first layer of titanium uniformly deposited over the wafer to a thickness of approximately 500 angstroms (Å) to improve the contact resistance between the bond pad and the solder bump. Next, a second base layer of conductive material of, for example, Nickel-Vanadium to a thickness of approximately 3600 Å is uniformly deposited as a barrier layer. A photoresist is then spun over the surface of the wafer and patterned to expose only the bond pad surfaces. Next, Lead-Tin (Pb—Sn) solder is deposited over the exposed bond pads through an electroplating process. The resist is then removed and the solder bumps are tested by a wafer sort process to determine the electrical fitness of the device.

FIG. 5 shows a prior art solder bump undergoing an E-Test. Wafer testing and sorting typically involves the use of probing technology wherein a probe card 30 containing a probe feature 35 engages solder bump 40 on a chip of the wafer so as to electrically test the underlying integrated circuit device 25. Probe feature 35 contacts the top surface of bump 40 that is formed over bond pad 27 of integrated circuit device 25.

When testing a solder bump of a device on a wafer such as illustrated in FIG. 5, it is often hard to prevent the oxidation of bump surface 45 prior to testing. Therefore, most categories of probing or testing utilize some form of "scrub" at the touch-down phase of a probe feature to a solder bump. Scrub applies to the process where the probe features on a probe card pierce (scrub) the layer of oxide that grows quickly on an exposed solder bump. Generally, scrub applies to the destruction of any non-conductive layer that produces a barrier between the test probes of a probe card and the solder bump. The purpose of the scrub is to break through the non-conductive layer on the solder bump in order to establish a good electrical contact between the probe features and the solder bump. Scrub occurs when the components of the probe card and its handler forces the wafer, and subsequently the solder bumps of a device of a wafer, against the probe features on the probe card causing the probe features to deflect and the non-conductive layer to break. Scrub is generated by a small horizontal movement of each probe feature across the surface of each corresponding solder bump as the probe features deflect. As the probe features move across the solder bump, they break and penetrate the non-conductive oxide layer, for example a lead oxide (PbO) layer, thereby establishing a good electrical contact between the probe features and the solder bumps.

As illustrated in FIG. 5, top surface 45 of solder bump 40 is very rough. The roughness of top surface 45 is the result of the electroplating process used to deposit the solder bump. When probe card 30 attempts to probe solder bump 40 with probe feature 35, asperities break off and stick to the tip of probe feature 35 causing probe feature 35 to become dirty and require cleaning. The tip of probe feature 35 collects asperities dislodged from top surface 45 of solder bump 40 during scrubbing, and probe feature 35 requires frequent cleaning. Frequent cleaning results in a shorter life of probe card 30 which translates to a considerable expense for wafer testing.

The presence of asperities or a rough surface 45 of solder bump 40 also results in a non-uniform contact area for probe feature 35. Thus, it is difficult to ascertain whether probe feature 35 makes good electrical contact with the top surface 45 of solder bump 40. This effects the reliability and repeatability of the testing. The presence of asperities on as-electroplated bumps also increases the contact resistance between solder bump 40 and probe feature 35. The soiling of the probe card, unreliable results, and increased contact resistance results in, perhaps inaccurate, lower test yields and, for example, bin switching, i.e., the recharacterization of device performance based upon testing results.

SUMMARY OF THE INVENTION

A method of testing an integrated circuit is disclosed. In one embodiment, the method includes depositing a solder bump on a surface of a bond pad on an integrated circuit chip, heat treating the solder bump, and testing the integrated circuit by probing the solder bump. In another aspect of the invention, a method of preparing a solder bump for testing is disclosed. The method includes depositing a solder bump on an integrated circuit chip, heat treating the solder bump, and testing the integrated circuit chip by probing the solder bump.

Additional features and benefits of the invention will become apparent from the detailed description, figures, and claims set forth below.

DETAILED DESCRIPTION OF THE INVENTION

The invention relates to a method of testing an integrated circuit particularly useful with C4-platform bumped wafers. In one embodiment, the invention involves a heat treatment of electroplated solder bumps into a smooth surface followed by a chemical treatment to remove any surface oxide. The process improves the probe card life by reducing the accumulation of solder bump material on the probe features of the probe card. The heat treated solder bumps also improve the mechanical integrity of the solder bumps by recrystallizing the grains into stress free bumps. This results in a more uniform contact between the probe feature of the probe card and the solder bump and no chipping of bump fragments or asperities. By the process of the invention, the contact resistance between the probe card and the solder bump is consistently reduced and the probe card life is improved. The heat treatment also results in better metallurgical bonding between the solder bumps and their corresponding bond pads which is important for high speed device testing and operation. The heat treatment also lowers the contact resistance between the solder bump and any base layer conductive material.

In the following detailed description, numerous specific details are set forth such as material types, dimensions, processing steps, etc., in order to provide a thorough understanding of the invention. It is to be appreciated that the specific details set forth need not be specifically adhered to to practice the invention. In other instances, well known elements and processing steps are not set forth in particular detail in order to avoid unnecessarily obscuring the invention.

FIGS. 6–14 schematically illustrate cross-sectional side views of a portion of an integrated circuit device having a bond pad and demonstrate an embodiment of the improved method of forming a solder bump to the bond pad and testing the electrical fitness of the bond pad by testing the solder bump.

Figure 1:
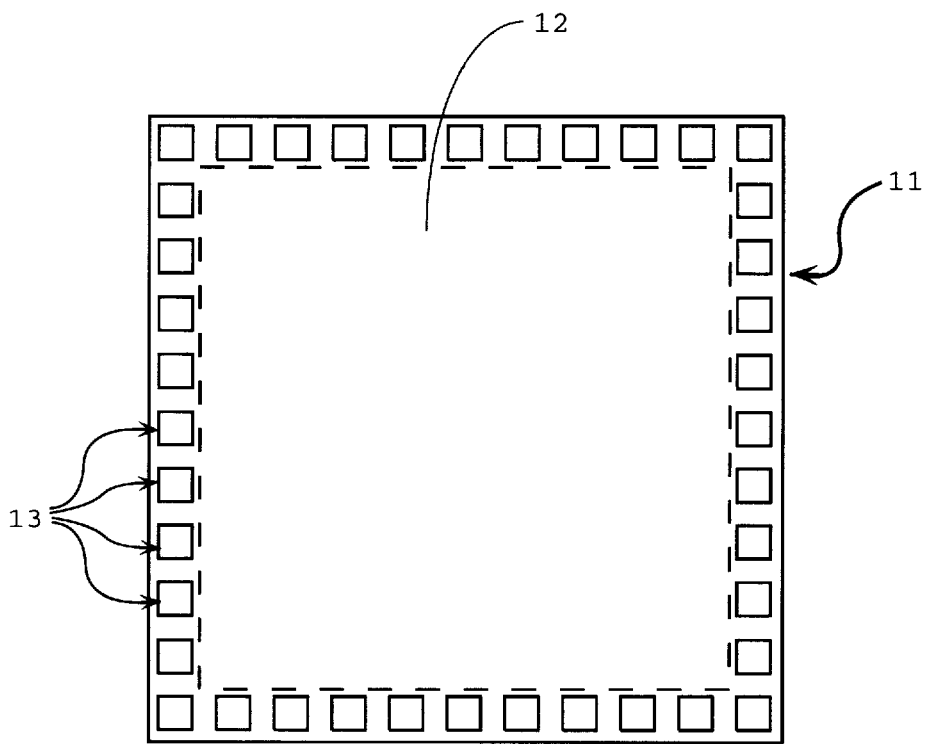
FIG. 1 is a schematic, planar, top view illustration of a prior art integrated circuit device intended for wire bond packaging.
Figure 2:
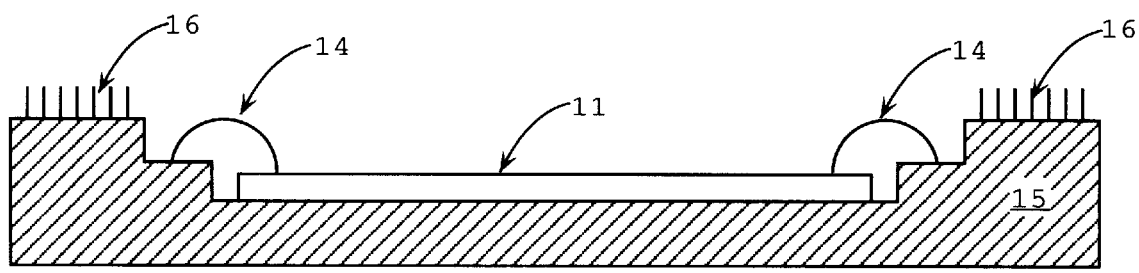
FIG. 2 is a schematic, cross-sectional, planar view illustration of the integrated circuit device of FIG. 1 after the device has been placed in a package.
Figure 3:
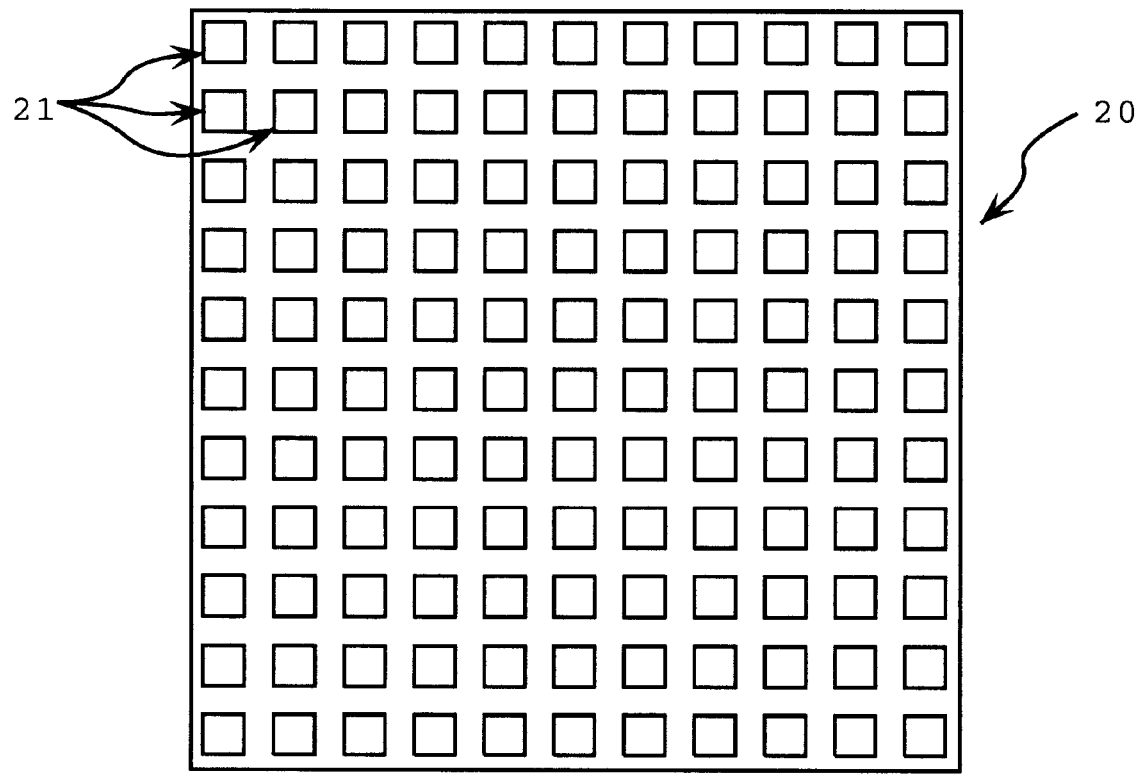
FIG. 3 is a schematic, planar, top view illustration of a prior art integrated circuit device intended for C4 packaging.
Figure 4:
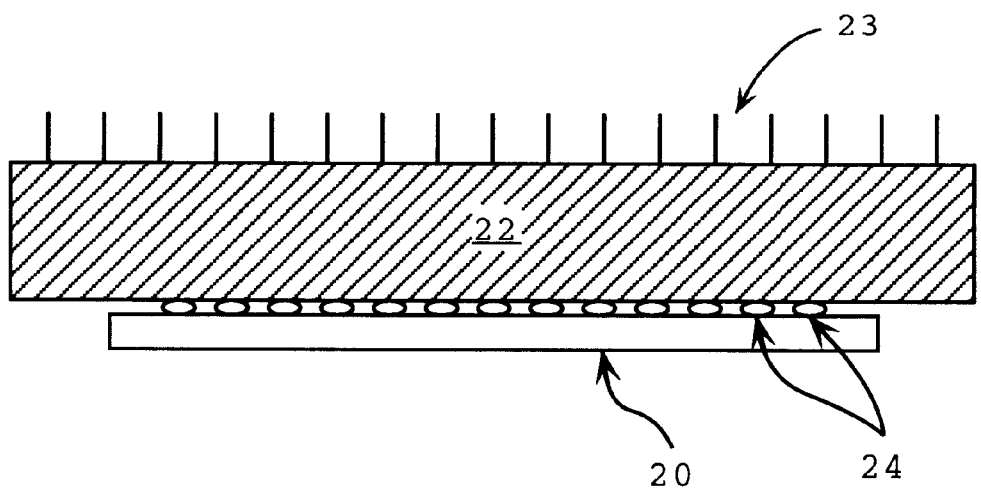
FIG. 4 is a schematic, cross-sectional, planar view illustration of the integrated circuit device of FIG. 3 after the device has been packaged.
Figure 5:
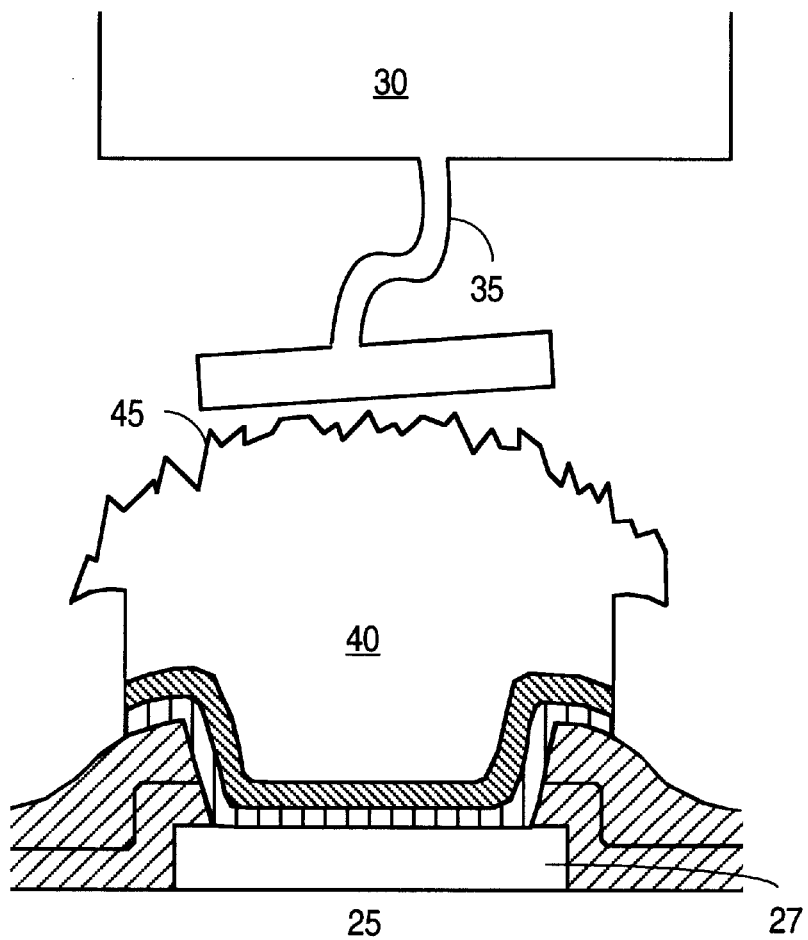
FIG. 5 is a schematic illustration of a cross-sectional view of a solder bump coupled to a bond pad of an integrated circuit device and undergoing electrical testing by a probe card in accordance with a prior art practice.
Figure 6:
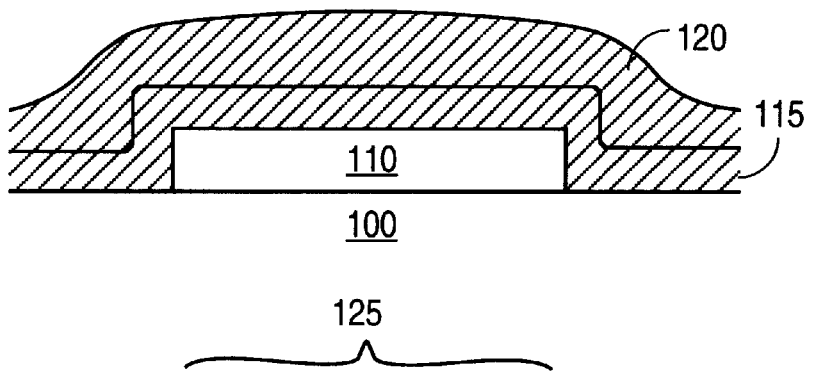
FIG. 6 is a schematic illustration of a cross-sectional side view of a bond pad on the top surface of an integrated circuit device encompassed in hard and soft passivation layers in accordance with a prior art practice and with an embodiment of the invention.

FIG. 6 shows a conventional integrated circuit device 100 having a bond pad 110 overlying a dielectric layer such as, for example, an oxide. Bond pad 110, for example, is a fifth layer of metal electrically connected in this instance to a transistor device at the base of integrated circuit device 100. Examples of material for bond pad 110 include, but are not limited to, aluminum (Al), aluminum-copper (Al—Cu) alloy, aluminum-copper-silicon (Al—Cu—Si) alloy metal bond pads. Bond pad 110 is representative of any number of bond pads overlying integrated circuit device 110 for this C4 platform technology. FIG. 3 supra illustrates an example of the bond pad configuration for C4-platform technology.

Overlying bond pad 110 is hard passivation layer 115, such as for example silicon nitride ($Si_3N_4$) deposited to a thickness of approximately 750 nanometers (nm). Hard passivation layer 115 serves in part as a barrier layer to protect integrated circuit device 100 from exposure to environmental contaminants, particularly moisture. Above hard passivation layer 115 is a soft passivation layer 120, such as for example a photodefinable polyimide passivation layer deposited to a final thickness of approximately 3.3 $\mu$m. Soft passivation layer 120 serves, in part, to protect hard passivation layer 115.

Figure 7:
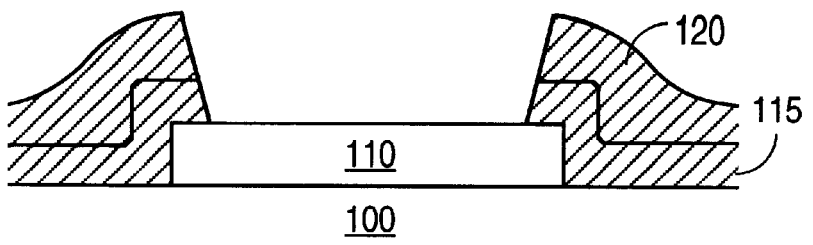
FIG. 7 is a schematic illustration of a cross-sectional view of the integrated circuit device of FIG. 6 showing the further processing step of forming an opening to the bond pad in accordance with an embodiment of the invention.

FIG. 7 illustrates the processing steps of forming an opening through soft passivation layer 120 and hard passivation layer 115 to bond pad 110. The opening 125 is made to provide electrical contact to bond pad 110. One method of forming opening 125 to bond pad 110 is as follows. First, in the embodiment where soft passivation layer 120 is a photodefinable polyimide layer, a portion of the polyimide layer over bond pad 110 is protected from light exposure. The remaining polyimide layer is exposed to ultraviolet light and developed. During development, the unexposed region of the polyimide layer is dissolved, exposing hard passivation layer 115 in an area above bond pad 110. At the same time, the polymer chains of the exposed polyimide layer begin to cross-link and imidize. After the exposure and develop step, the remaining polyimide layer is cured, such as for example, by exposing the wafer to a temperature of about 400° C. During the curing step, polymer chains further cross-link and imidize and solvent is driven away. This process makes the polyimide layer harder. This process also tightens the distribution of some electrical parameters of the transistors.

Once soft passivation layer 120 that is a polyimide layer is cured, a portion of hard passivation layer 115 overlying bond pad 110 is removed. In the example where hard passivation layer 115 is silicon nitride, a portion of the silicon nitride layer is etched by a plasma etcher. The plasma etcher uses a conventional etchant, such as for example, a $NF_3$/He and $SF_6$/He etch chemistry. The etch exposes bond pad 110.

In the embodiment described, the silicon nitride etch chemistry contains fluorine. In the process of the etch, it is possible that some fluorine containing residues were left on the surface of bond pad 110 or on polyimide layer 130. To the extent that fluorine containing residues remain on the surface of bond pad 110, the residues might inhibit the bonding between a solder bump and bond pad 110. To remove the fluorine containing residues, an optional, very short duration, sputter etch (a safety etch) may be used.

Figure 8:
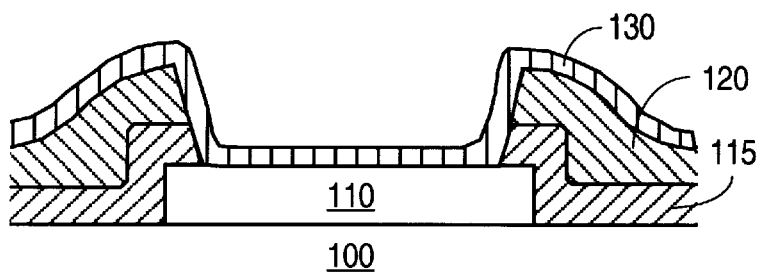
FIG. 8 is a schematic illustration of a cross-sectional view of the integrated circuit device of FIG. 6 showing the further processing step of depositing a first base layer conductive material over the exposed bond pad in accordance with an embodiment of the invention.
Figure 9:
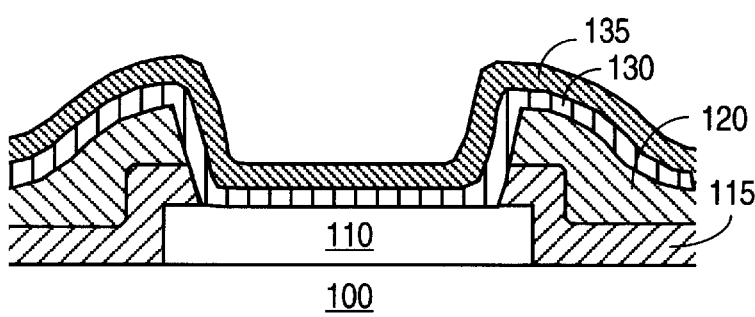
FIG. 9 is a schematic illustration of a cross-sectional view of the integrated circuit device of FIG. 6 showing the further processing step of depositing a second base layer conductive material over the first base layer conductive material in accordance with an embodiment of the invention.

Once an opening 125 is made to bond pad 110, FIG. 8 illustrates the further processing step of uniformly depositing a first base layer conductive material 130 over the surface of device 110. First base layer conductive material 130 is a layer of titanium (Ti) deposited to a thickness of approximately 500 Å. One purpose of the first base layer conductive material 130 is to improve the contact resistance between a subsequently deposited solder bump and bond pad 110. Next, as shown in FIG. 9, a second base layer conductive material 135 is uniformly deposited over integrated circuit device 110. Second base layer conductive material 135 is, for example, a Nickel-Vanadium (Ni—V) deposited to a thickness of approximately 3600 Å. The Nickel-Vanadium second base layer conductive material 135 acts as a diffusion barrier layer and provides good adhesion characteristics to the subsequently deposited solder bump.

Figure 10:
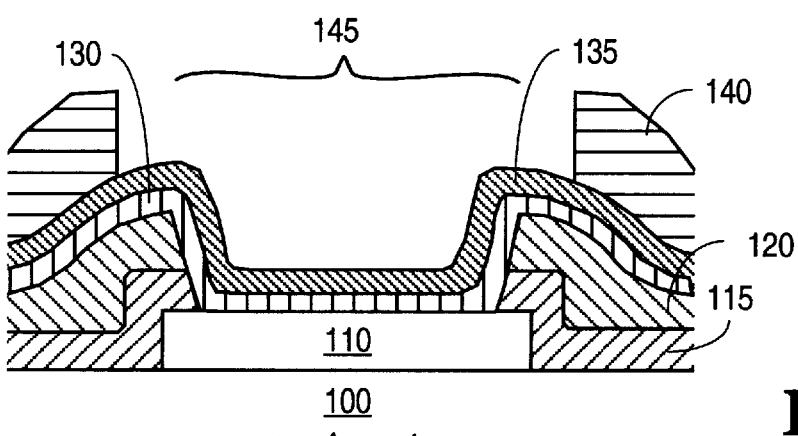
FIG. 10 is a schematic illustration of a cross-sectional view of the integrated circuit device of FIG. 6 showing the further processing step of spinning a photoresist over the integrated circuit device to expose an area above the bond pad in accordance with an embodiment of the invention.
Figure 11:
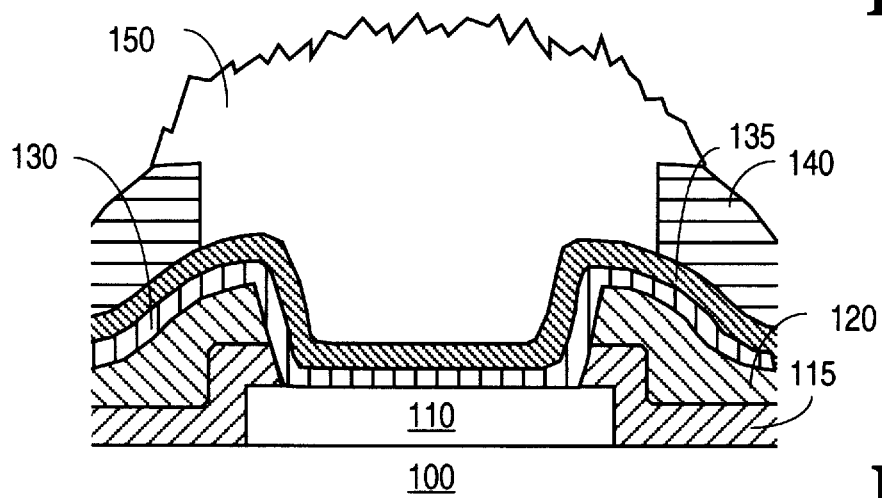
FIG. 11 is a schematic illustration of a cross-sectional view of the integrated circuit device of FIG. 6 showing the further processing step of electroplating a solder bump over the bond pad in accordance with an embodiment of the invention.

FIG. 10 shows the further processing step of spinning a photoresist over integrated circuit device 100 and patterning the photoresist through lithography to expose an area 145 over bond pad 110. Next, as shown in FIG. 11, solder bump 150, such as for example, a Lead-Tin (Pb—Sn) solder bump is deposited by way of an electroplating process using, for example, a single cup plater. The electroplating process forms Pb—Sn bump 150 over the bilayer of conductive materials 130 and 140 overlying bond pad 110. Once formed, photoresist layer 140 is stripped, for example, by a wet chemical stripping process as known in the art. Once photoresist layer 140 is stripped, FIG. 12 shows solder bump 150 overlying the bilayer of conductive materials 130 and 135 and electrically connected to bond pad 110.

Figure 13:
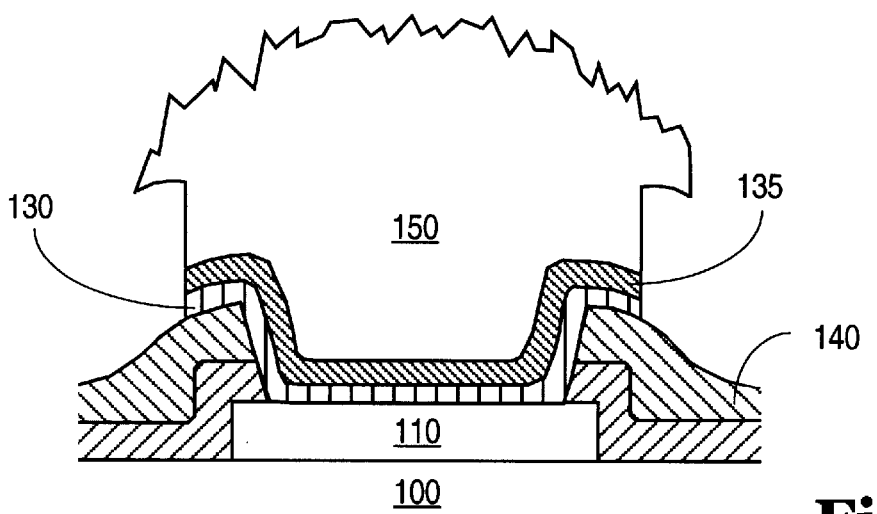
FIG. 13 is a schematic illustration of a cross-sectional view of the integrated circuit device of FIG. 6 showing the further processing step of removing the base layer metal adjacent to the solder bump.

Next, as shown in FIG. 13, the bilayer of conductive materials 130 and 135 overlying soft passivation layer 140 and adjacent solder bump 150 is removed either by a chemical etch or a dry etch to electrically isolate solder bump 150. To further isolate solder bump 150, the wafer is treated with oxygen ash to convert possibly electrically conducting graphite surface of polyimide soft-passivation layer 140 to a non-conducting polyimide surface. The ashing process is schematically illustrated in FIG. 14.

Figure 12:
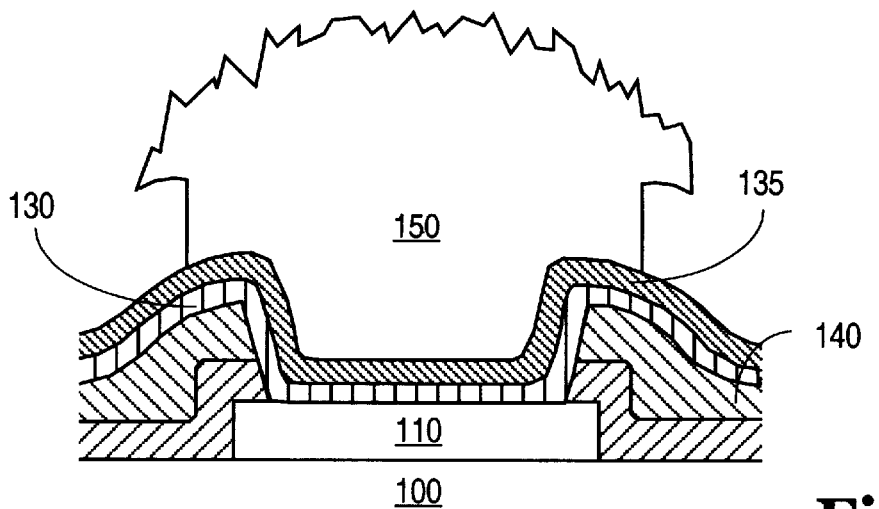
FIG. 12 is a schematic illustration of a cross-sectional view of the integrated circuit device of FIG. 6 showing the further processing step of removing the photoresist layer from the top surface of the integrated circuit device in accordance with an embodiment of the invention.
Figure 14:
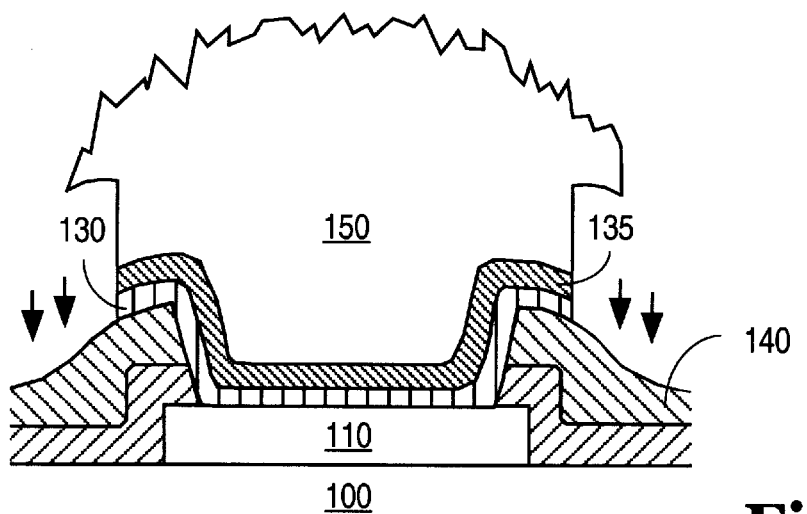
FIG. 14 is a schematic illustration of a cross-sectional view of the integrated circuit device of FIG. 6 showing the further processing step of treating the device with an oxygen ash.
Figure 15:
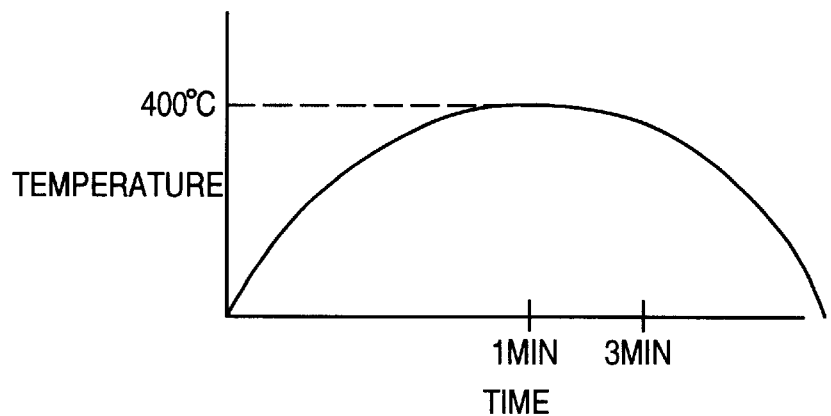
FIG. 15 is a graphical representation of the reflow process in accordance with an embodiment of the invention.
Figure 16:
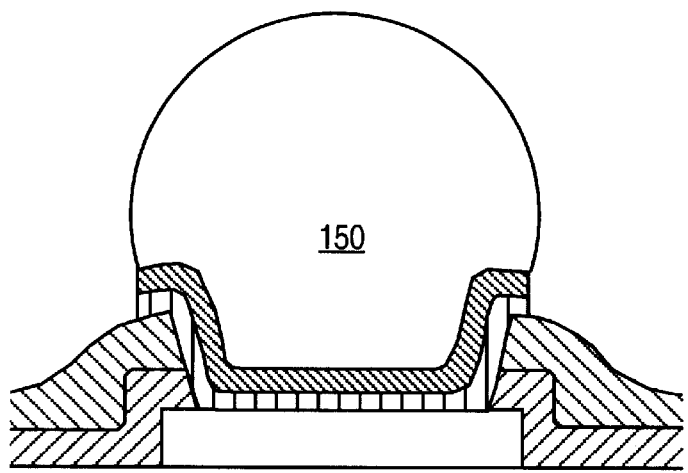
FIG. 16 is a schematic illustration of a cross-sectional view of the integrated circuit device of FIG. 6 the appearance of a solder bump after a heat reflow process.

FIGS. 12–14 show that the electroplating process leaves the top surface of solder bump 150 very rough with potentially many asperities. Thus, the invention contemplates that at this stage, prior to testing solder bump 150 with, for example, a probe card testing apparatus, the wafer undergo a heat treatment reflow process. In one embodiment, the reflow process involves placing a wafer having a plurality of integrated circuit devices, such as integrated circuit device 100, and solder bumps formed where desired to bond pads of the individual integrated circuit devices of the wafer, in an oven. The oven is then heated to 400° C. in a hydrogen atmosphere and then cooled. In one embodiment, the reflow process takes approximately 1–3 minutes to ramp the oven to 400° C. before cooling. The reflow process is graphically demonstrated in FIG. 15. It is to be appreciated that the reflow process conditions can vary for a particular process. The reflow process melts the solder bump and allows it to cool and reform in the form of a sphere with a top surface that is smooth as illustrated in FIG. 16. It is recommended that enough thermal energy be supplied to melt the solder bump and allow the surface of the solder bump to reform.

Utilizing a reflow process to reform solder bump 150 prior to testing has many advantages. First, the reformation of solder bump 150 yields a solder bump that is mechanically stronger with a more refined microstructure. Second, the contact resistance between bond pad 110 and the bilayer of conductive materials 130 and 135 is reduced because of the heat treatment of the materials. In terms of testing, reforming solder bump 150 to have a spherical surface improves the contact resistance between the probe card and solder bump 150. This allows a large area for contact between a probe tip which facilitates more accurate testing and better reproducibility which decreases unnecessary bin switching. A reformed solder bump also reduces or eliminates the presence of asperities on the surface of the solder bump which minimizes the soiling of the probe card tips and increases the life of the probe card and test efficiency.

Figure 17:
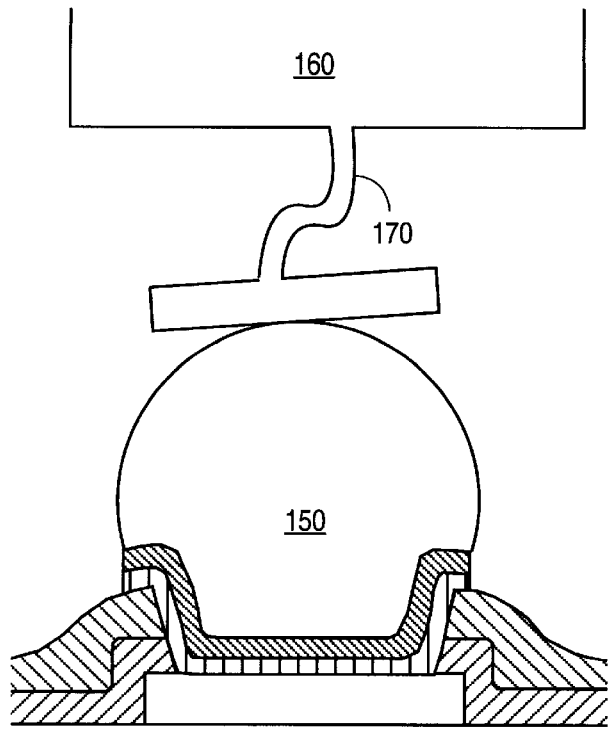
FIG. 17 is a schematic illustration of the integrated circuit device of FIG. 6 showing the further processing step of electrically testing the solder bump in accordance with an embodiment of the invention.

FIG. 17 illustrates a testing procedure wherein solder bump 150 is tested by probe card 160. In FIG. 17, probe card 160 includes a probe feature 170 having a probe tip that contacts the top surface of solder bump 150. The spherical shape of solder bump 150 eliminates the asperities that were broken off in a prior art process during a scrubbing process by the probe tip during testing. Thus, in the process of the invention, asperities do not collect on the probe tip of probe feature 170. This reduces the cleaning frequency of the probe tips which extend the life of the probe card, increases throughput, and increases the accuracy of the testing.

As noted above, an oxide layer (e.g., PbO) may quickly form over solder bump 150 after the electroplating process. When it is unduly thick, this oxide may not melt during the reflow process, but should break or peel away from solder bump 150. It is to be appreciated that oxide or other residue buildup that remains on the surface of solder bump 150 after the reflow process can be cleaned by a scrubbing process such as described above. Alternatively, the invention also contemplates the further processing step of removing deposits such as oxide prior to scrubbing. In one embodiment, the invention contemplates the further processing step of cleaning solder bump 150 with a chemical treatment to remove the deposits. Such a method includes, but is not limited to, dipping a wafer containing a plurality of integrated circuit devices (like integrated circuit device 100), the integrated circuit devices having a plurality of solder bumps (like solder bump 150, overlying bond pads), in a methyl sulfonic acid.

Figure 18:
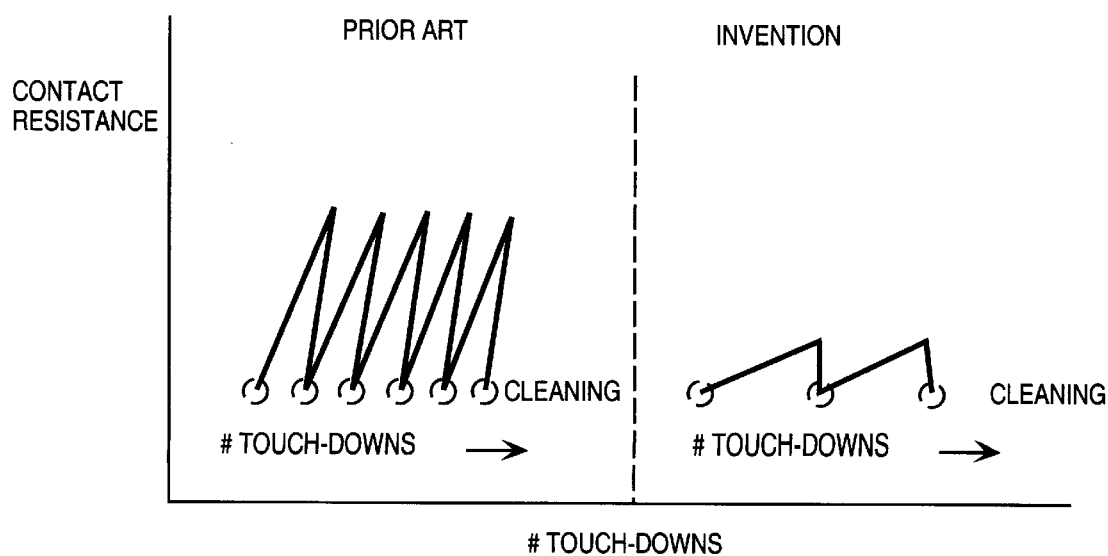
FIG. 18 is a graphical representation of the contact resistance as a function of touch-downs of the probe features of a probe card.

The process of the invention extends the probe card life by minimizing mechanical/abrasive cleaning to remove asperities from probe tips while maintaining low, nominal and minimum probe to solder bump contact resistance. FIG. 18 shows a graph of the nominal contact resistance between a probe feature and a solder bump over time for touch-downs on solder bumps exposed by a prior art process and by the process of the invention. FIG. 18 shows that the resistance measured on the solder bumps exposed by the process of the invention is very consistent, maintained in a less than one ohm region over a series of touch-downs by probe features. This shows that the solder bump surface is smooth, consistent, and free of asperities and that the probe features do not get significantly soiled which would otherwise cause the resistance to increase. Such consistency is not evident with solder bumps being tested as-electroplated. The probe features soil and show contact resistances greater than one ohm. The jagged nature of the graphical representation of FIG. 16 shows the contact resistance increasing as the probe tips get soiled, followed by a probe cleaning, continued touch-downs, and continued soiling (increased resistance), cleaning, etc. FIG. 16 also shows that the probe features used to probe the solder bumps exposed by the process of the invention do not need to be cleaned as often as the probe features used to probe as-electroplated solder bumps. This is represented by the example shown in FIG. 16 by fewer cleaning steps (two) for the process of the invention as compared to an as-electroplated process (six). FIG. 16 demonstrates that the process of the invention yields a higher degree of re-sort repeatability using gross die bin results over the as-electroplated process and reduced bin-switching.

The above description is directed to the use of solder bumps in C4 platform packaging technology. It is to be appreciated, however, that the invention is not limited to the C4 platform. Instead, the process described above can be used and is contemplated for use in any process where conductive bumps are used in assembly technology.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrated rather than a restrictive sense.

What is claimed is:

1. A method of testing an integrated circuit device comprising:

depositing a solder bump on a surface of a bond pad on an integrated circuit device;

heat treating the solder bump to transform a surface of the solder bump from a first texture that comprises a rough surface to a second texture that comprises a smooth surface;

testing the integrated circuit device by probing the solder bump.

2. The method of claim 1, prior to depositing a solder bump on a surface of a bond pad, further comprising:

depositing a base layer conductive material over the bond pad.

3. The method of claim 2, depositing a base layer conductive material over the bond pad comprising:

depositing a first base layer conductive material of titanium over the bond pad; and depositing a second base layer conductive material of nickel-vanadium over the first base layer conductive material.

4. The method of claim 1, wherein the solder bump is a lead-tin material.

5. The method of claim 1, wherein heat treating the solder bump comprising:

placing the integrated circuit device in an environment for heat treatment; and heating the integrated circuit device to a temperature of approximately 400° C. in a hydrogen atmosphere.

6. The method of claim 1, wherein after heat treating the solder bump, further comprising:

removing any accumulated impurities on the surface of the solder bump.

7. The method of claim 6, wherein the removing any accumulated impurities on the surface of the solder bump comprising treating said integrated circuit device with a methyl sulfonic acid.

8. The method of claim 6, wherein the removing accumulated impurities on the surface of the solder bump comprises exposing the solder bump to a chemical treatment.

9. The method of claim 1, wherein heat treating the solder bump comprises:

placing the integrated circuit device in an environment for heat treatment; and heating the environment from a first temperature that is less than a second temperature to the second temperature and cooling to the first temperature.

10. A method of preparing a solder bump for testing comprising:

depositing a solder bump on an integrated circuit chip;

heat treating the solder bump to transform a surface of the solder bump from a first texture that comprises a rough surface to a second texture that comprises a smooth surface;

testing said integrated circuit device by probing the solder bump.

11. The method of claim 10, wherein the solder bump is a lead-tin material.

12. The method of claim 10, wherein heat treating the solder bump comprises:

placing the integrated circuit device in an environment for heat treatment; and heating the integrated circuit device to a temperature of approximately 400° C. in a hydrogen atmosphere.

13. The method of claim 10, wherein after heat treating the solder bump, the method further comprising:

removing any accumulated impurities on the surface of the solder bump.

14. The method of claim 13, wherein the removing any accumulated impurities on the surface of the solder bump comprising treating the integrated circuit device with a methyl sulfonic acid.

15. The method of claim 13, wherein the removing accumulated impurities on the surface of the solder bump comprises exposing the solder bump to a chemical treatment.

16. The method of claim 10, wherein heat treating the solder bump comprises:

placing the integrated circuit device in an environment for heat treatment; and heating the environment from a first temperature that is less than a second temperature to the second temperature and cooling to the first temperature.

* * * * *